(12) United States Patent
Song et al.

(10) Patent No.: US 12,456,708 B2
(45) Date of Patent: Oct. 28, 2025

(54) SEMICONDUCTOR PACKAGES

(71) Applicant: Samsung Electronics Co., Ltd., Suwon-si (KR)

(72) Inventors: Sang Sub Song, Suwon-si (KR); Seongho Yoon, Suwon-si (KR); Ki-Hong Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 412 days.

(21) Appl. No.: 18/188,368

(22) Filed: Mar. 22, 2023

(65) Prior Publication Data

US 2024/0047409 A1 Feb. 8, 2024

(30) Foreign Application Priority Data

Aug. 2, 2022 (KR) .................. 10-2022-0096391

(51) Int. Cl.
*H01L 23/00* (2006.01)
*H01L 23/495* (2006.01)
*H01L 23/528* (2006.01)
*H01L 25/16* (2023.01)

(52) U.S. Cl.
CPC .......... *H01L 24/73* (2013.01); *H01L 23/4952* (2013.01); *H01L 23/5283* (2013.01); *H01L 24/85* (2013.01); *H01L 25/16* (2013.01); *H01L 2224/73207* (2013.01); *H01L 2225/06506* (2013.01); *H01L 2225/06517* (2013.01)

(58) Field of Classification Search
CPC ...................................... H01L 24/73
USPC ...................................... 257/734
See application file for complete search history.

(56) References Cited

U.S. PATENT DOCUMENTS

| | | | |
|---|---|---|---|
| 9,773,766 | B2 | 9/2017 | Ye et al. |
| 10,199,364 | B2 | 2/2019 | Lalam et al. |
| 10,763,183 | B2 | 9/2020 | Ogushi et al. |
| 11,064,603 | B2 | 7/2021 | Park et al. |
| 11,244,738 | B2 | 2/2022 | Na et al. |
| 2015/0221624 | A1* | 8/2015 | Ye .......................... H01L 23/145 257/777 |
| 2019/0318971 | A1* | 10/2019 | Ogushi .................. H01L 25/18 |

(Continued)

FOREIGN PATENT DOCUMENTS

| | | |
|---|---|---|
| CN | 102412241 B | 12/2014 |
| JP | 5034593 B2 | 7/2012 |

*Primary Examiner* — Ajay Arora
(74) *Attorney, Agent, or Firm* — Wolf, Greenfield & Sacks, P.C.

(57) ABSTRACT

A semiconductor package includes a package substrate having opposing first and second surfaces, a control chip on the first surface, a mode selection connection terminal between the control chip and the package substrate, a stack structure comprising stacked memory chips spaced apart from the control chip on the first surface, a first power pad and a wire pad that are spaced apart at the first surface, a first external connection terminal on the second surface, and first and second interconnection lines in the package substrate. The first power pad and the wire pad are spaced apart from the control chip. The first interconnection line connects the first power pad to the first external connection terminal. The second interconnection line connects the wire pad to the mode selection connection terminal. The first external connection terminal is configured to provide a ground voltage or a power voltage.

20 Claims, 11 Drawing Sheets

(56) References Cited

U.S. PATENT DOCUMENTS

2019/0357351 A1\* 11/2019 Park .................. H01P 5/028
2021/0397569 A1  12/2021 Song
2022/0046789 A1   2/2022 Park \* cited by examiner

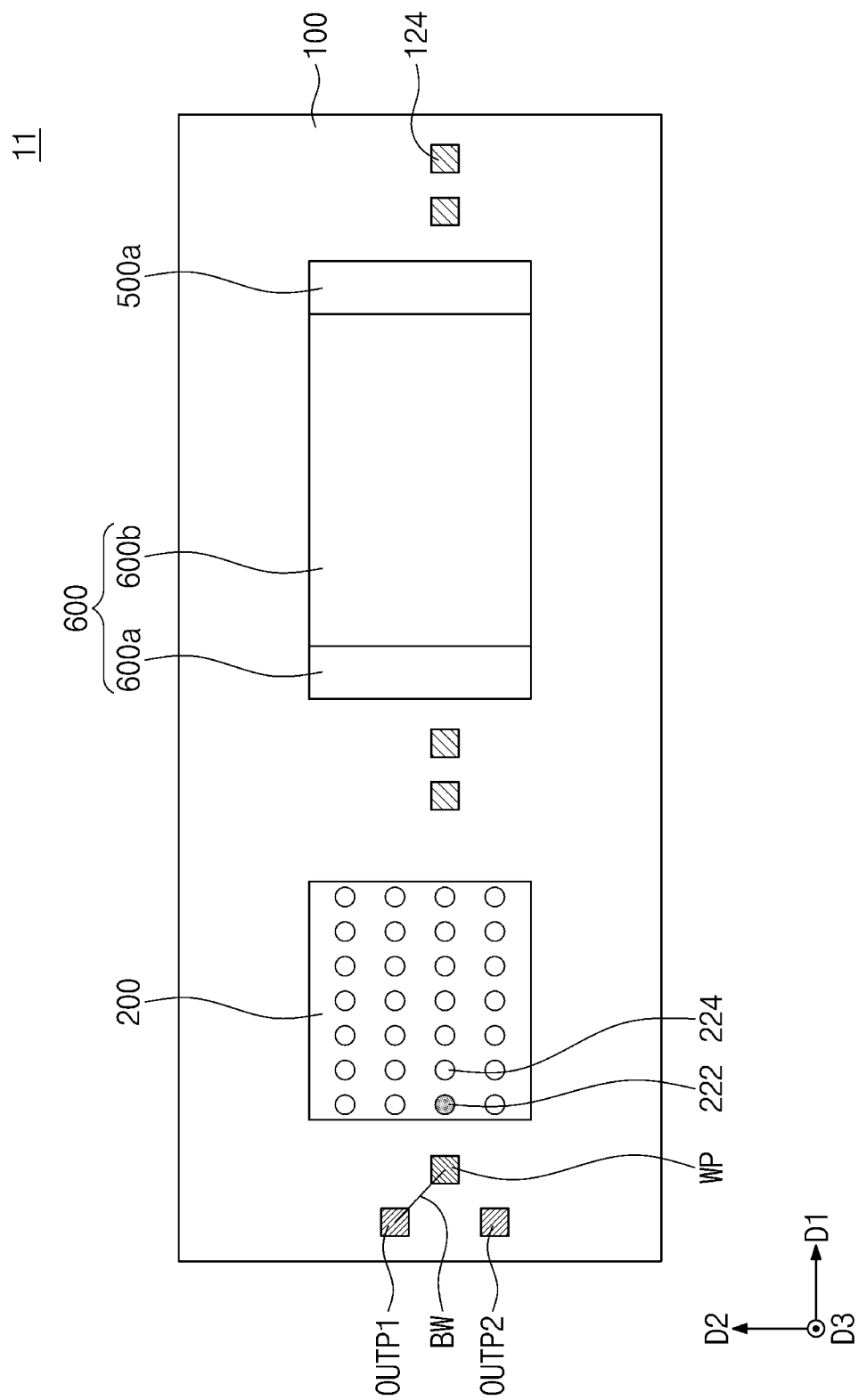

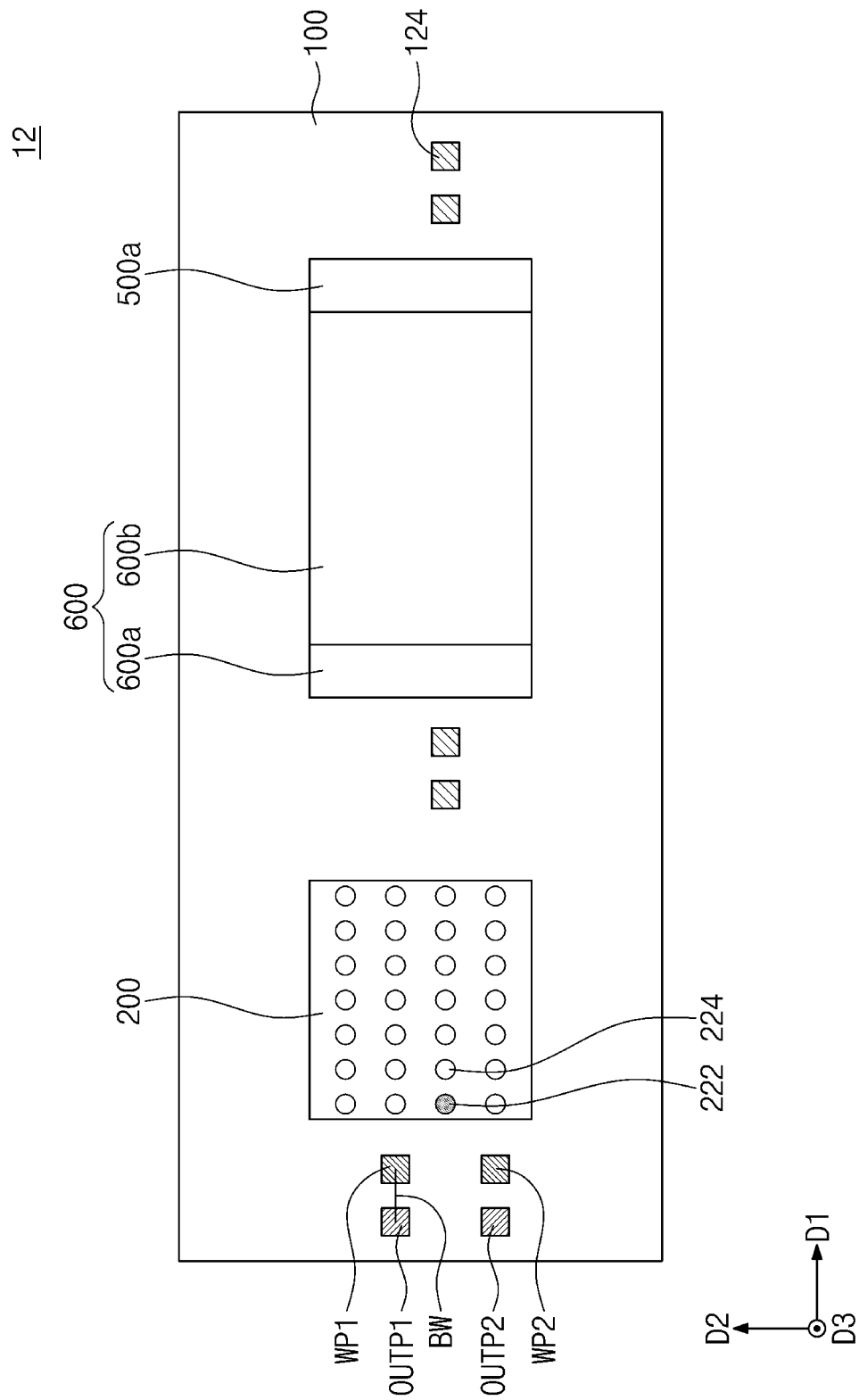

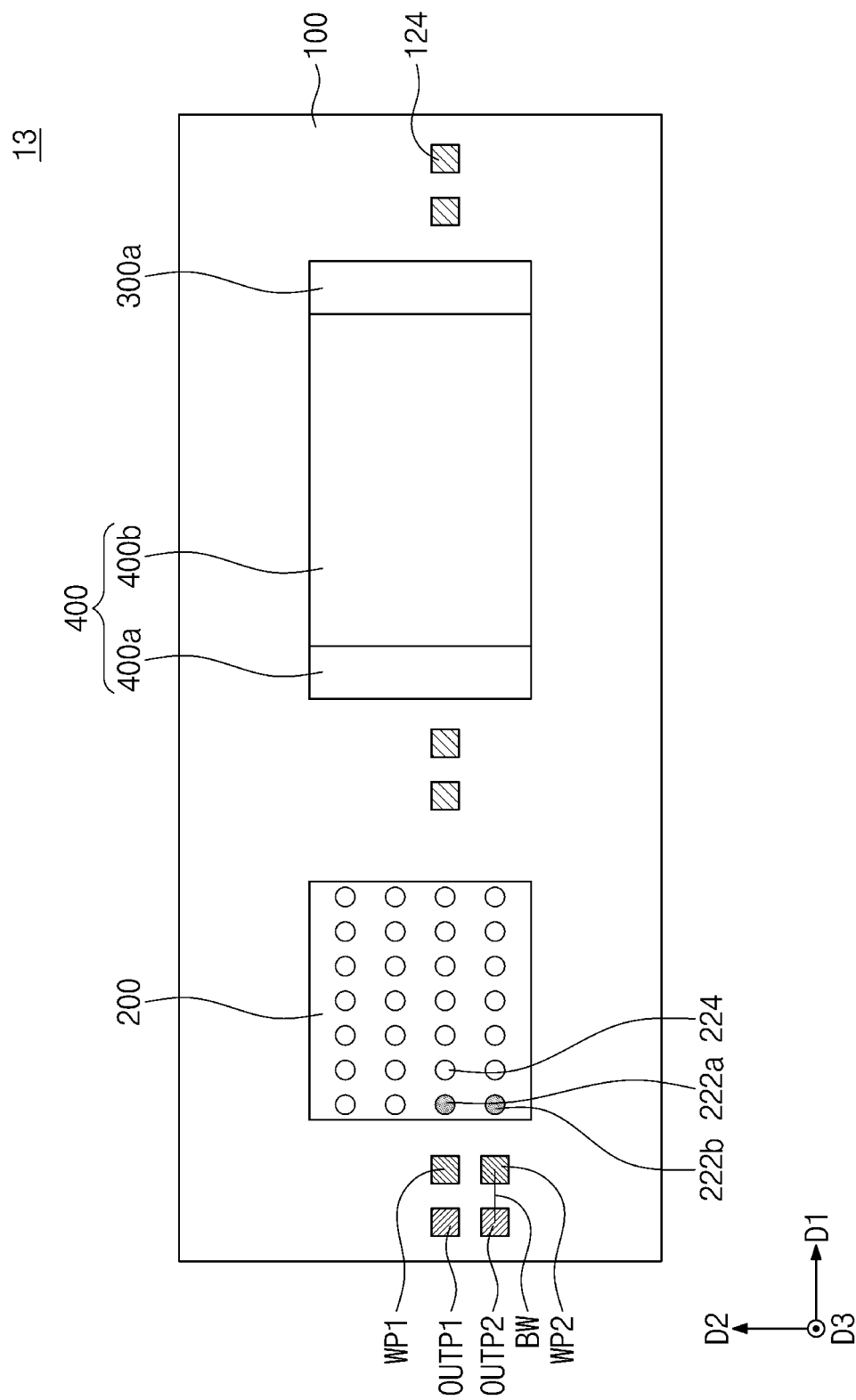

SEMICONDUCTOR PACKAGES

CROSS-REFERENCE TO RELATED APPLICATIONS

This U.S. non-provisional patent application claims priority under 35 U.S.C. § 119 to Korean Patent Application No. 10-2022-0096391, filed on Aug. 2, 2022, in the Korean Intellectual Property Office, the entire contents of which are hereby incorporated by reference.

FIELD

The present disclosure relates to a semiconductor package, and more particularly, to a multi-chip package having a plurality of stacked chips.

BACKGROUND

An integrated circuit chip may be realized in the form of a semiconductor package so as to be used in an electronic product. In a typical semiconductor package, a semiconductor chip may be mounted on a printed circuit board (PCB) and may be electrically connected to the printed circuit board through bonding wires or bumps. Various techniques for reliability improvement, electrical characteristics improvement and miniaturization of semiconductor packages have been studied with development of the electronics industry.

SUMMARY

Embodiments of the inventive concepts may provide a semiconductor package configured to be used with one kind of or the same type of printed circuit board regardless of a channel number of or number of channels for a plurality of stacked memory chips.

In an aspect, a semiconductor package may include a package substrate having a first surface and a second surface that are opposite to each other; a control chip on the first surface of the package substrate; a mode selection connection terminal between the control chip and the package substrate; a stack structure spaced apart from the control chip on the first surface of the package substrate, the stack structure comprising a plurality of stacked memory chips a first power pad at the first surface of the package substrate, a wire pad at the first surface of the package substrate and spaced apart from the first power pad; a first external connection terminal on the second surface of the package substrate; and a first interconnection line and a second interconnection line in the package substrate. The first power pad and the wire pad are spaced apart from the control chip, the first interconnection line electrically connects the first power pad to the first external connection terminal, the second interconnection line electrically connects the wire pad to the mode selection connection terminal, and the first external connection terminal is configured to provide a ground voltage or a power voltage to the first power pad.

In an aspect, a semiconductor package may include a package substrate, a control chip on the package substrate; a stack structure spaced apart from the control chip on the package substrate, the stack structure comprising a plurality of stacked memory chips, a first power pad, a second power pad, a first wire pad, and a second wire pad at a top surface of the package substrate, a first external connection terminal and a second external connection terminal on a bottom surface of the package substrate; a pair of first interconnection lines and a pair of second interconnection lines in the package substrate; a mode selection connection terminal under the control chip; and a conductive connection member external to the package substrate that electrically connects the first power pad to the first wire pad, or electrically connects the second power pad to the second wire pad. The first wire pad, the second wire pad, the first power pad, and second power pad are spaced apart from each other; one of the pair of first interconnection lines electrically connects the first power pad to the first external connection terminal, and another of the pair of first interconnection lines electrically connects the second power pad to the second external connection terminal; one of the pair of second interconnection lines electrically connects the first wire pad to the mode selection connection terminal, and another of the pair of second interconnection lines electrically connects the second wire pad to the mode selection connection terminal; and the first external connection terminal and the second external connection terminal are configured to provide voltages having different magnitudes to the first power pad and the second power pad, respectively.

In an aspect, a semiconductor package may include a package substrate, a control chip on the package substrate; a stack structure spaced apart from the control chip on the package substrate, the stack structure comprising a plurality of stacked memory chips; a first power pad, a second power pad, a first wire pad, and a second wire pad that are spaced apart from each other at a top surface of the package substrate; a first mode selection connection terminal and a second mode selection connection terminal between the control chip and the package substrate; a first external connection terminal and a second external connection terminal on a bottom surface of the package substrate; and a pair of first interconnection lines and a pair of second interconnection lines in the package substrate. One of the pair of first interconnection lines electrically connects the first power pad to the first external connection terminal, and another of the pair of first interconnection lines electrically connects the second power pad to the second external connection terminal; one of the pair of second interconnection lines electrically connects the first wire pad to the first mode selection connection terminal, and another of the pair of second interconnection lines electrically connects the second wire pad to the second mode selection connection terminal; and the first mode selection connection terminal or the second mode selection connection terminal is selectively configured to be coupled to a voltage.

In an aspect, a semiconductor package may include a package substrate having a first surface and a second surface which are opposite to each other; a power pad and a wire pad at the first surface of the package substrate and spaced apart from each other a first substrate pad, a second substrate pad and a third substrate pad that are at the first surface of the package substrate, are spaced apart from the power pad and the wire pad, and are spaced apart from each other; external connection terminals on the second surface of the package substrate, a first interconnection line, a second interconnection line and a third interconnection line in the package substrate; a control chip mounted on the first surface of the package substrate, the control chip vertically overlapping with the first substrate pad and the second substrate pad, a mode selection connection terminal and a chip connection terminal under the control chip; a stack structure on the first surface of the package substrate and spaced apart from the control chip, the stack structure comprising a plurality of stacked memory chips; a metal connection line connecting one or more of the stacked memory chips to the third substrate pad; and a molding layer on the control chip, the stack structure and the package substrate. The first interconnection line electrically connects one of the external connection terminals to the power pad. The second interconnection line electrically connects the first substrate pad to the wire pad. The third interconnection line electrically connects the second substrate pad to the third substrate pad.

BRIEF DESCRIPTION OF THE DRAWINGS

FIGS. 6A and 6B are plan views illustrating a semiconductor package according to some embodiments of the inventive concepts.

FIGS. 7A and 7B are plan views illustrating a semiconductor package according to some embodiments of the inventive concepts.

FIGS. 8A and 8B are plan views illustrating a semiconductor package according to some embodiments of the inventive concepts.

DETAILED DESCRIPTION OF EMBODIMENTS

Embodiments of the inventive concepts will now be described more fully with reference to the accompanying drawings.

Figure 1:
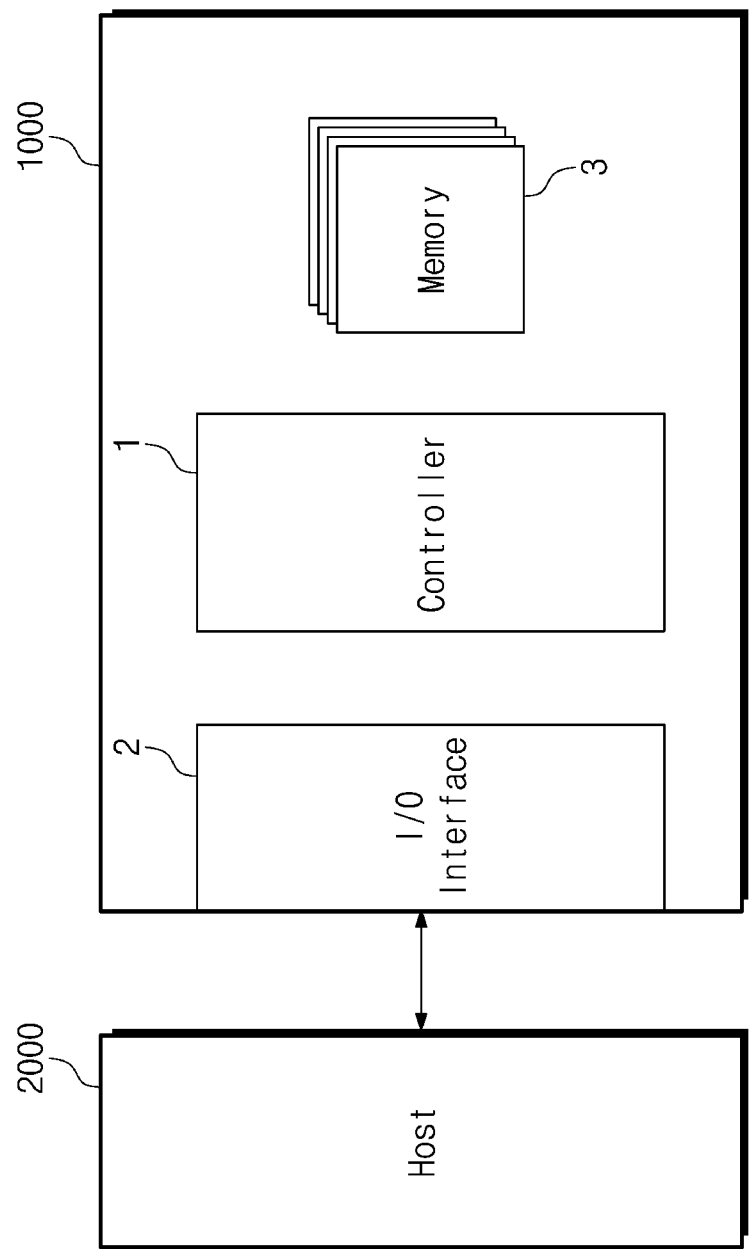
FIG. 1 is a schematic block diagram illustrating a semiconductor package according to some embodiments of the inventive concepts

FIG. 1 is a schematic block diagram illustrating a semiconductor package according to some embodiments of the inventive concepts.

Referring to FIG. 1, a semiconductor package may be a universal flash storage package (UFS package) 1000. The UFS package 1000 may store or read data in response to a read/write request of a host 2000. The host 2000 may be an external electronic device. The UFS package 1000 may include a controller 1, an input/output (I/O) interface 2, and a memory device 3.

The controller 1 may exchange signals with the host 2000 through the I/O interface 2. Here, the signals between the controller 1 and the host 2000 may include command signals, address signals, and/or data. The controller 1 may write data in a corresponding memory device 3 described below or may read data from the corresponding memory device 3, in response to the command signal of the host 2000.

The I/O interface 2 may provide physical connection between the host 2000 and the UFS package 1000. In other words, the I/O interface 2 may provide interfacing with the UFS package 1000, which corresponds to a bus format of the host 2000. The bus format of the host 2000 may be universal serial bus (USB), PCI express, serial ATA (SATA), and/or parallel ATA (PATA).

The memory device 3 may be a non-volatile memory device. The memory device 3 may be provided in plurality. The plurality of memory devices 3 may be NAND flash memory devices having large-capacity and high-speed storage ability. Alternatively, the memory devices 3 may include phase-change random access memory (PRAM) devices, magnetic random access memory (MRAM) devices, resistive random access memory (ReRAM) devices, ferromagnetic random access memory (FRAM) devices, and/or NOR flash memory devices.

Figure 2:
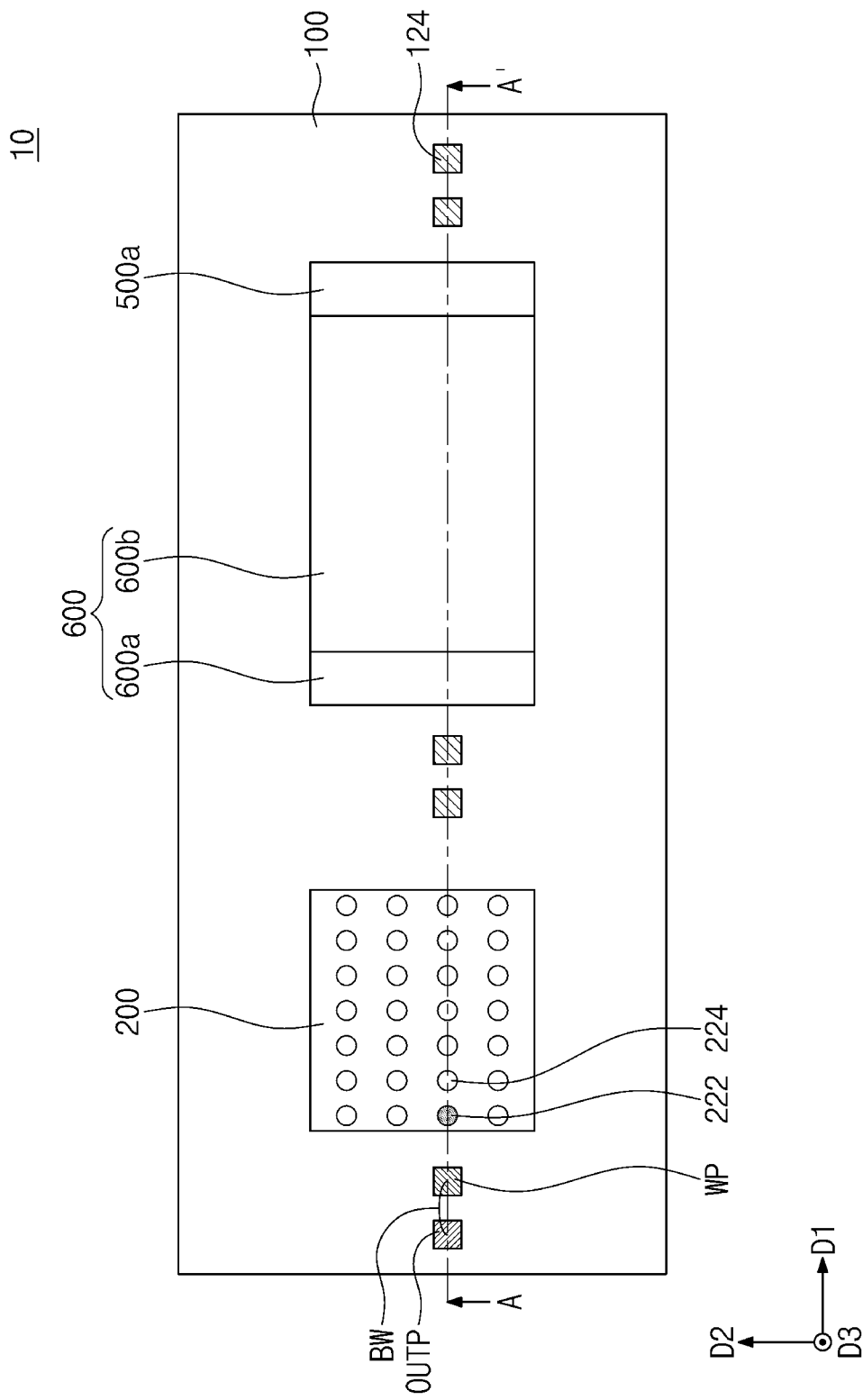
FIG. 2 is a plan view illustrating a semiconductor package according to some embodiments of the inventive concepts.
Figure 3:
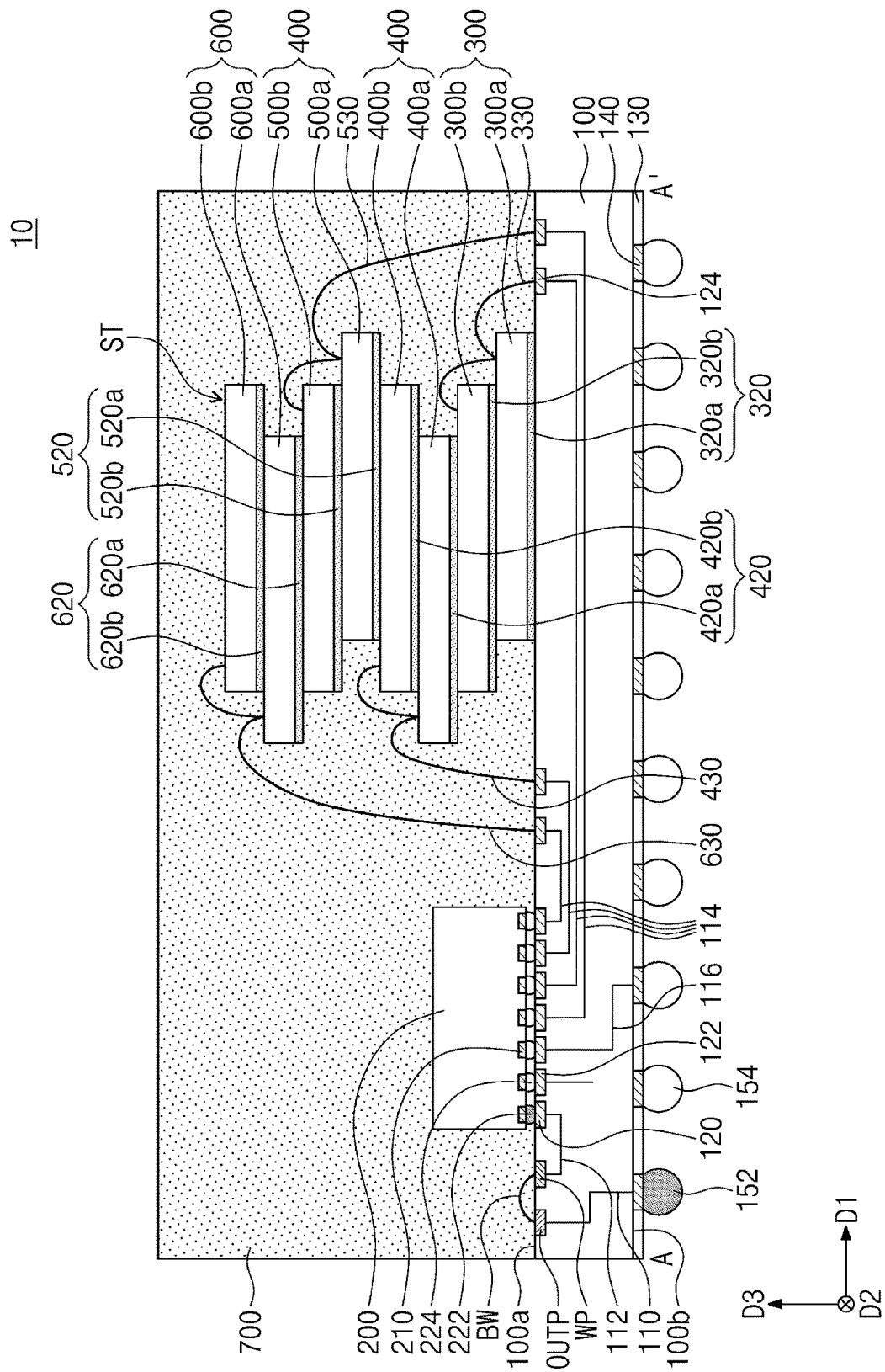
FIG. 3 is a cross-sectional view taken along a line A-A' of FIG. 2.
Figure 4:
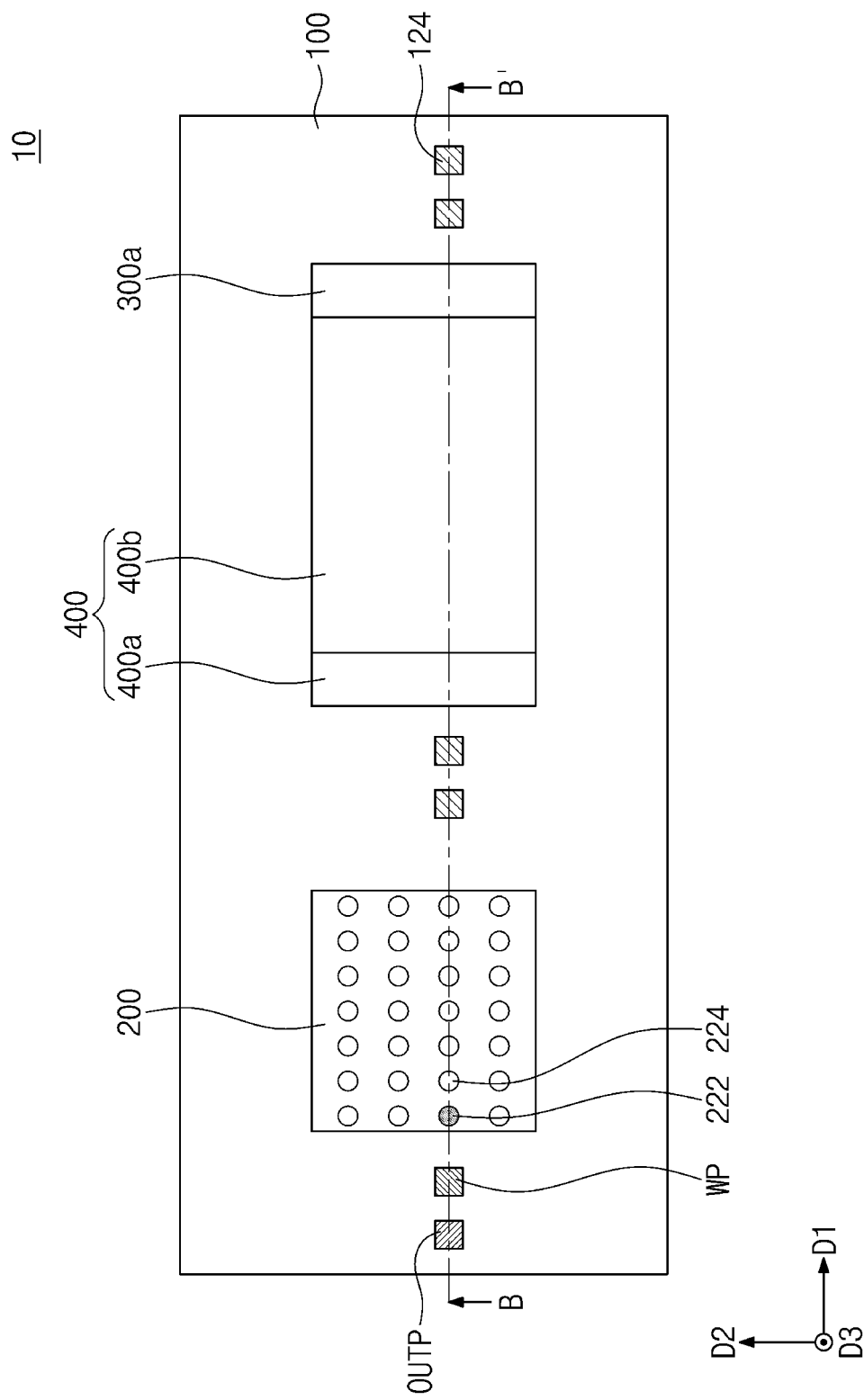
FIG. 4 is a plan view illustrating a semiconductor package according to some embodiments of the inventive concepts.
Figure 5:
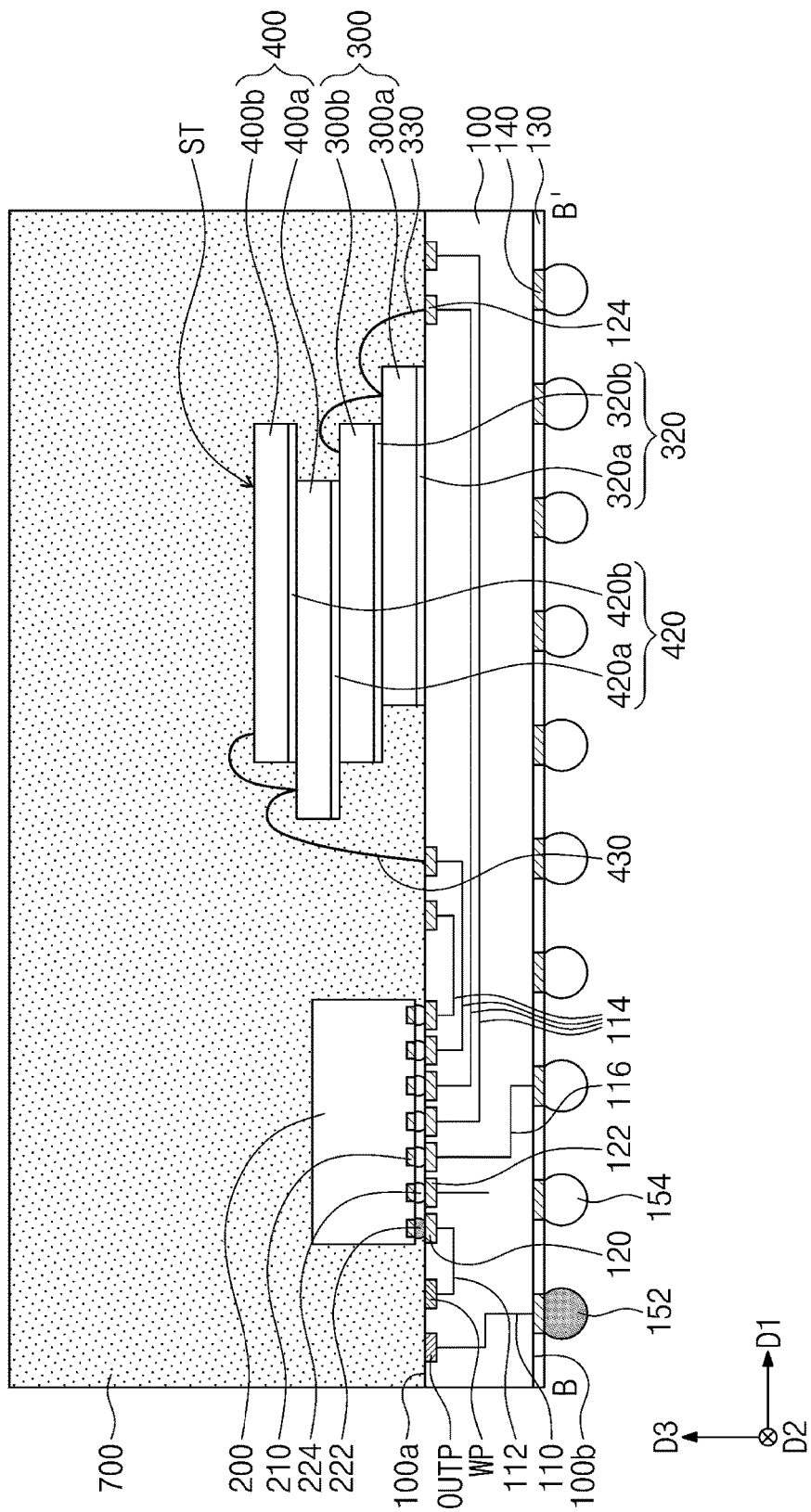
FIG. 5 is a cross-sectional view taken along a line B-B' of FIG. 4.

FIG. 2 is a plan view illustrating a semiconductor package according to some embodiments of the inventive concepts. FIG. 3 is a cross-sectional view taken along a line A-A' of FIG. 2. FIG. 4 is a plan view illustrating a semiconductor package according to some embodiments of the inventive concepts. FIG. 5 is a cross-sectional view taken along a line B-B' of FIG. 4.

Referring to FIGS. 2 and 3, a semiconductor package 10 may include a package substrate 100, a control chip 200, a stack structure ST, a conductive connection member BW, and a molding layer 700.

In some embodiments, the semiconductor package 10 may be a multi-chip package (MCP) including different kinds of semiconductor chips. The semiconductor package 10 may be a system-in-package (SIP) in which semiconductor chips are stacked or arranged in a single package to perform an independent function or respective functions.

The package substrate 100 may have a first surface 100a and a second surface 100b, which are opposite to each other. For example, the package substrate 100 may include a printed circuit board (PCB), a flexible substrate, and/or a tape substrate. The package substrate 100 may be a multi-layered circuit board having vias and various circuits therein.

In the present specification, a first direction D1 may refer to a direction parallel to the first surface 100a of the package substrate 100, a second direction D2 may refer to a direction which is parallel to the first surface 100a of the package substrate 100 and intersects the first direction D1, and a third direction D3 may refer to a direction perpendicular to the first surface 100a of the package substrate 100 (also referred to herein as a vertical direction). The terms "first," "second," "third," etc., may be used herein merely to distinguish one element, component, layer, direction, etc., from another.

A power pad OUTP and a wire pad WP may be provided at the first surface 100a of the package substrate 100. The power pad OUTP and the wire pad WP may be spaced apart from each other in the first direction D1 or the second direction D2. The power pad OUTP and the wire pad WP may not be connected to each other through interconnection lines provided in the package substrate 100. For example, the package substrate 100 may be free of interconnection lines therein that electrically connect the power pad OUTP and the wire pad WP. In other words, if the conductive connection member BW described below in detail does not exist, the power pad OUTP and the wire pad WP may not be connected to each other. The power pad OUTP and the wire pad WP may include a metal such as aluminum (Al).

In the present specification, it may be understood that when components are referred to as being 'connected' to each other, they may be electrically connected to each other or may be connected to each other through direct contact with each other (i.e., with no intervening components therebetween).

The power pad OUTP may be spaced apart from the control chip 200 when viewed in a plan view. The power pad OUTP may not vertically overlap (e.g., may not overlap along a vertical direction, shown as direction D3) with the control chip 200. The power pad OUTP may not be connected directly to chip pads 210, described below, of the control chip 200. The power pad OUTP may not be connected directly to the chip pads 210 of the control chip 200 through a single connection member such as a bump, a pillar, a pin, or a wire.

The power pad OUTP may be connected to the chip pads 210 of the control chip 200 through only the wire pad WP. That is, the package substrate 100 may be free of interconnection lines therein that electrically connect the power pad OUTP to the chip pads 210.

First, second, and third substrate pads 120, 122 and 124 may be provided at the first surface 100a of the package substrate 100. The first to third substrate pads 120, 122 and 124 may be spaced apart from the power pad OUTP and the wire pad WP in the first direction D1 and/or the second direction D2. In some embodiments, the wire pad WP and the first substrate pad 120 may be a single merged (e.g., continuous) pad.

The first substrate pad 120 may overlap with a mode selection connection terminal 222 described below in the third direction D3. The second substrate pad 122 may be provided in plurality. Each of the plurality of second substrate pads 122 may overlap with each of chip connection terminals 224 described below in the third direction D3. The third substrate pad 124 may be provided in plurality. The plurality of third substrate pads 124 may be disposed adjacent to the stack structure ST described below in detail. Each of the first to third substrate pads 120, 122 and 124 may include a metal such as aluminum (Al).

External connection pads 140 may be provided on the second surface 100b of the package substrate 100. The external connection pads 140 may be exposed by an insulating layer 130. The insulating layer 130 may cover side surfaces of the external connection pads 140. The insulating layer 130 may include a silicon oxide layer, a silicon nitride layer, or a silicon oxynitride layer.

First and second external connection terminals 152 and 154 may be provided on the external connection pads 140. The first and second external connection terminals 152 and 154 may be in contact with the external connection pads 140. The first external connection terminal 152 may be configured to be supplied with a ground voltage (Vss) or a power voltage (Vdd). The second external connection terminal 154 may be provided in plurality. Each of the plurality of second external connection terminals 154 may function to transmit/receive an electrical signal to/from an external device. However, embodiments of the inventive concepts are not limited thereto, and in certain embodiments, the ground voltage or the power voltage may be applied to each of the second external connection terminals 154, like the first external connection terminal 152. This may be changed depending on a design of the semiconductor package 10 to be manufactured. For example, each of the first and second external connection terminals 152 and 154 may be a solder ball. The semiconductor package 10 may be mounted on a module substrate (not shown) through the solder balls to form a memory module.

First, second, third, and fourth interconnection lines 110, 112, 114 and 116 may be provided in the package substrate 100. The first interconnection line 110 may connect the power pad OUTP to one of the external connection pads 140, which overlaps with the first external connection terminal 152 in the third direction D3. The second interconnection line 112 may connect the wire pad WP to the first substrate pad 120. The third interconnection line 114 may be provided in plurality. The plurality of third interconnection lines 114 may connect the second substrate pads 122 to the third substrate pads 124, respectively. The fourth interconnection line 116 may be provided in plurality. The plurality of fourth interconnection lines 116 may connect the second substrate pads 122 to some of the external connection pads 140, respectively. The first to fourth interconnection lines 110, 112, 114 and 116 are schematically illustrated in FIGS. 3 and 5, and a shape and a position of each of the interconnection lines may be variously modified. Each of the first to fourth interconnection lines 110, 112, 114 and 116 may include a metal such as gold (Au) or copper (Cu).

The control chip 200 may be provided on the first surface 100a of the package substrate 100. The control chip 200 may overlap with the first substrate pad 120 and the second substrate pads 122 in the third direction D3 (e.g., in the vertical direction). The control chip 200 may include an integrated circuit. For example, the control chip 200 may be a logic chip including a logic circuit. The logic chip may be a controller for controlling first, second, third, and fourth memory chips 300, 400, 500 and 600 described below. The control chip 200 may be a processor chip (e.g., an ASIC) used as a host such as a CPU, a GPU, or a SoC. The control chip 200 may be electrically connected to the package substrate 100 through the mode selection connection terminal 222 and the chip connection terminals 224 described below. The control chip 200 may be mounted on the package substrate 100 by a flip-chip method, which provides a bonding interface therebetween with a shortened electrical path (also referred to herein as a flip-chip bonding interface).

The chip pads 210 may be provided on a bottom surface (i.e., an active surface) of the control chip 200.

The mode selection connection terminal 222 and the chip connection terminals 224 may be provided under the chip pads 210, respectively. That is, the mode selection connection terminal 222 and the chip connection terminals 224 may be between the control chip 200 and the package substrate 100. The control chip 200 may be electrically connected to an external device through the chip pads 210, the mode selection connection terminal 222 and the chip connection terminals 224. The mode selection connection terminal 222 may be a mode selection pin for recognizing the ground voltage or power voltage applied from the outside (e.g., from an external device). The term 'mode selection' may refer to recognizing a number of channels for or a channel number of the memory chips included in the semiconductor package 10. The control chip 200 may recognize the number of channels connected to the first to fourth memory chips 300, 400, 500 and 600 described below by applying or not applying the ground voltage or power voltage to the mode selection connection terminal 222. The mode selection connection terminal 222 may overlap with the first substrate pad 120 in the third direction D3 (e.g., in the vertical direction). The mode selection connection terminal 222 may be electrically connected to the wire pad WP through the first substrate pad 120 and the second interconnection line 112.

The chip connection terminal 224 may be provided in plurality. Each of the plurality of chip connection terminals 224 may function as a power supply pin for supplying power to the control chip 200, or as a data pin of transmitting/receiving a signal. Each of the chip connection terminals 224 may overlap with each of the second substrate pads 122 in the third direction D3 (e.g., in the vertical direction). Some of the chip connection terminals 224 may be electrically connected to the first to fourth memory chips 300, 400, 500 and 600 described below through some of the second substrate pads 122, the third interconnection lines 114 and the third substrate pads 124. Others of the chip connection terminals 224 may be electrically connected to some of the second external connection terminals 154 through others of the second substrate pads 122 and the fourth interconnection lines 116.

Each of the mode selection connection terminal 222 and the chip connection terminals 224 may include at least one of a solder, a pillar, or a bump. Each of the mode selection connection terminal 222 and the chip connection terminals 224 may include a conductive material such as a metal.

The stack structure ST may be provided on the first surface 100a of the package substrate 100. The stack structure ST may be spaced apart from the control chip 200 in the first direction D1 or the second direction D2. The stack structure ST may include the first to fourth memory chips 300, 400, 500 and 600 sequentially stacked on the first surface 100a of the package substrate 100. The number of chips included in the first to fourth memory chips 300, 400, 500 and 600 is shown as 8 in FIG. 3 by way of example, but the number of the chips included in the stack structure ST may be changed. The first to fourth memory chips 300, 400, 500 and 600 may include non-volatile memory devices such as NAND flash memory devices. The first memory chips 300a and 300b may include the same kind or type of memory chips. Likewise, the second memory chips 400a and 400b may include the same kind or type of memory chips, the third memory chips 500a and 500b may include the same kind or type of memory chips, and the fourth memory chips 600a and 600b may include the same kind or type of memory chips.

The first memory chips 300a and 300b may be sequentially adhered on the package substrate 100 by using first adhesive members 320a and 320b. The second memory chips 400a and 400b, the third memory chips 500a and 500b and the fourth memory chips 600a and 600b may be sequentially adhered on the first memory chips 300a and 300b by using second, third, and fourth adhesive members 420a, 420b, 520a, 520b, 620a and 620b.

More particularly, the first memory chips 300a and 300b and a lowermost second memory chip 400a may be stacked in a cascade or stepped structure. The second memory chips 400a and 400b and a lowermost third memory chip 500a may be stacked in a cascade or stepped structure. The third memory chips 500a and 500b and a lowermost fourth memory chip 600a may be stacked in a cascade or stepped structure. The first to fourth memory chips 300, 400, 500 and 600 included in the stack structure ST may be stacked in a cascade or stepped structure repeated alternately in a direction toward the control chip 200 and a direction away from the control chip 200.

Each of the first to fourth memory chips 300, 400, 500 and 600 may be electrically connected to each of the third substrate pads 124 by each of first to fourth metal connection lines 330, 430, 530 and 630. As a result, each of the first to fourth memory chips 300, 400, 500 and 600 may be electrically connected to the control chip 200. For example, each of the first to fourth metal connection lines 330, 430, 530 and 630 may include a bonding wire.

The first, second, third, and fourth metal connection lines 330, 430, 530 and 630 may determine a channel number (e.g., a number of channels) in the semiconductor package 10. In the case in which the number of the metal connection lines is 4 as shown by way of example in FIG. 3, the channel number may be 4. However, embodiments of the inventive concepts are not limited thereto, and the number of the metal connection lines may be changed and in this case, the channel number in the semiconductor package 10 may be changed.

The conductive connection member BW may connect the power pad OUTP and the wire pad WP to each other. For example, the conductive connection member BW may include a bonding wire. The conductive connection member BW may be formed simultaneously with the first to fourth metal connection lines 330, 430, 530 and 630.

The power pad OUTP and the wire pad WP may be electrically connected to each other by the conductive connection member BW. As a result, the ground voltage or power voltage applied to the first external connection terminal 152 may be transmitted to the mode selection connection terminal 222 through the conductive connection member BW. The control chip 200 may recognize the ground voltage or power voltage applied to the mode selection connection terminal 222 to recognize the channel number in the semiconductor package 10. In some embodiments, when the conductive connection member BW is provided as shown in FIG. 3, the control chip 200 may recognize the channel number of 4.

The molding layer 700 may be provided to cover the package substrate 100, the control chip 200 and the stack structure ST. The molding layer 700 may include an insulating material. For example, the molding layer 700 may include an epoxy molding compound (EMC).

FIG. 4 is a plan view illustrating a semiconductor package according to some embodiments of the inventive concepts. FIG. 5 is a cross-sectional view taken along a line B-B' of FIG. 4. Hereinafter, the descriptions to the same features as mentioned above will be omitted for ease and convenience in explanation.

Referring to FIGS. 4 and 5, in some embodiments, the stack structure ST may include only the first and second memory chips 300 and 400. In this case, only the first and second metal connection lines 330 and 430 may be provided, and thus the channel number may be 2.

When the channel number is 2, the conductive connection member BW may not be provided. In this case, the power pad OUTP may not be electrically connected to the wire pad WP. As a result, the ground voltage or power voltage may not be applied to the mode selection connection terminal 222, and thus the control chip 200 may recognize the channel number of 2. That is, the control chip 200 may be configured for the number of channels based on the presence (or absence) of a voltage (e.g., ground or power) applied to the mode selection terminal.

The semiconductor package 10 according to the inventive concepts may include the package substrate 100, the control chip 200 on the package substrate 100, and the stack structure ST including a plurality of stacked memory chips on the package substrate 100.

The power pad OUTP disposed at (e.g., adjacent) the first surface 100a of the package substrate 100 may be connected to the first external connection terminal 152 provided on the second surface 100b of the package substrate 100 through the first interconnection line 110 in the package substrate 100. The first substrate pad 120 and the wire pad WP provided at the first surface 100a of the package substrate 100 may be connected to each other through the second interconnection line 112 in the package substrate 100. The first substrate pad 120 may be connected to the control chip 200 through the mode selection connection terminal 222 between the control chip 200 and the package substrate 100. In addition, the power pad OUTP and the wire pad WP may be selectively connected to each other by the conductive connection member BW which is selectively provided. Thus, the control chip 200 may be connected to the power pad OUTP by the conductive connection member BW outside or external to the package substrate 100, and not by an interconnection line in (e.g., within one or more layers of) the package substrate 100.

In this case, the mode selection may be performed using one kind (i.e., the same configuration) of the package substrate 100 regardless of the channel number of the plurality of stacked memory chips. Thus, there may be no need to manufacture an additional package substrate 100 or variations of package substrates 100 depending on the channel number. In other words, the package substrate 100 may be manufactured with a single or same configuration that is independent of (and compatible with) various memory chip configurations. As a result, a process or fabrication cost of the semiconductor package 10 may be reduced. In addition, the flip-chip method may be used to provide a bonding interface with a reduced length of an electrical path, and thus electrical characteristics of the semiconductor package 10 may be improved.

Figure 6B:
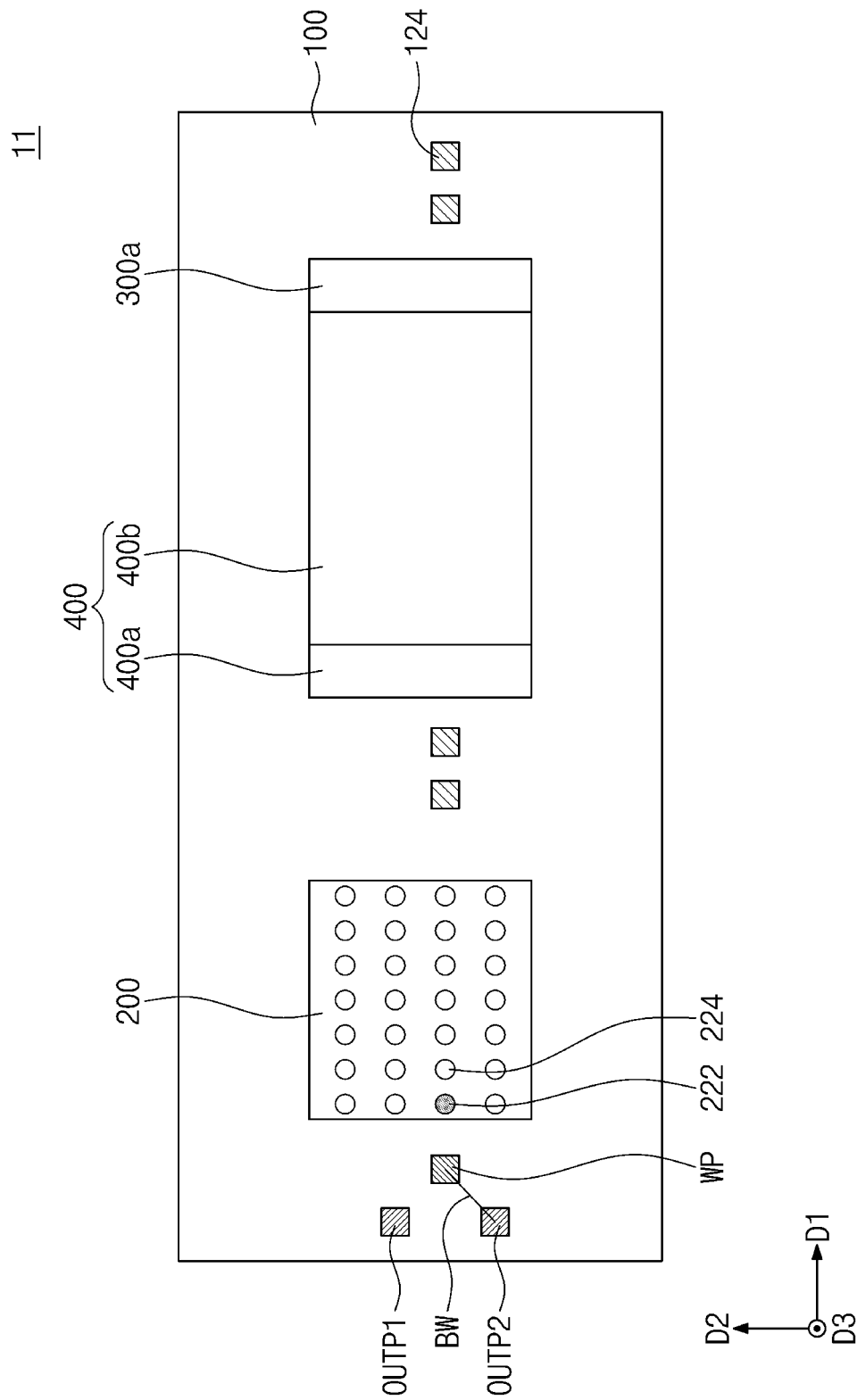

FIGS. 6A and 6B are plan views illustrating a semiconductor package according to some embodiments of the inventive concepts. Hereinafter, the descriptions to the same features as mentioned with reference to FIGS. 2 to 5 will be omitted for ease and convenience in explanation.

Referring to FIGS. 6A and 6B, a semiconductor package 11 may include a first power pad OUTP1 and a second power pad OUTP2. Each of the first and second power pads OUTP1 and OUTP2 may correspond to the power pad OUTP of FIG. 3. The first and second power pads OUTP1 and OUTP2 may be spaced apart from each other. Each of the first and second power pads OUTP1 and OUTP2 may be spaced apart from the wire pad WP.

In this case, a pair of first external connection terminals 152 may be provided. Voltages having different magnitudes may be applied to the pair of first external connection terminals 152, respectively. For example, the ground voltage may be applied to one of the pair of first external connection terminals 152, and the power voltage may be applied to the other of the pair of first external connection terminals 152.

A pair of first interconnection lines 110 may be provided. One of the pair of first interconnection lines 110 may connect the first power pad OUTP1 to one of the first external connection terminals 152, and the other of the pair of first interconnection lines 110 may connect the second power pad OUTP2 to the other of the first external connection terminals 152.

Here, the conductive connection member BW may selectively connect between the first power pad OUTP1 and the wire pad WP or between the second power pad OUTP2 and the wire pad WP. Thus, the control chip 200 may recognize only one of the ground voltage and the power voltage.

Figure 7B:
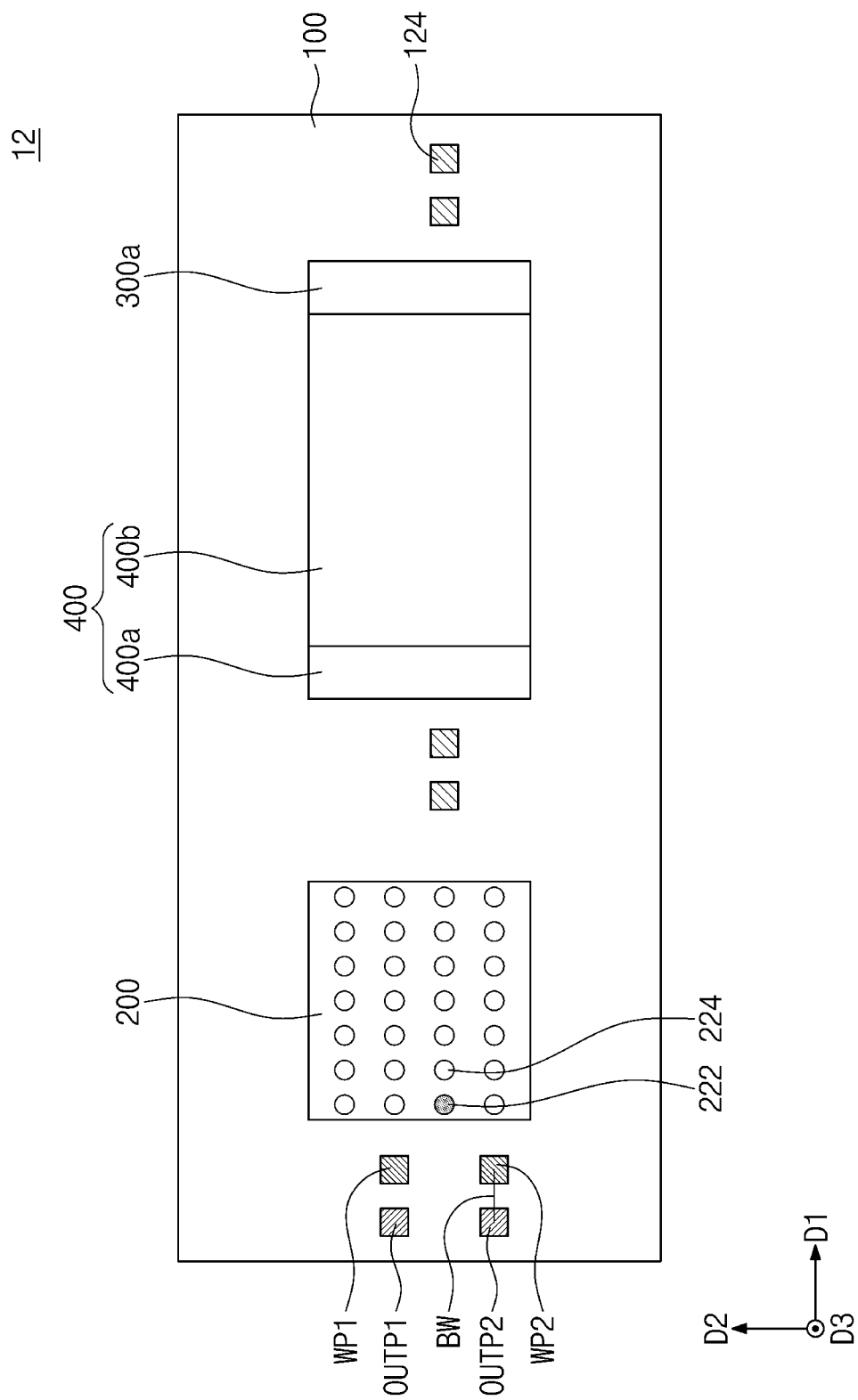

FIGS. 7A and 7B are plan views illustrating a semiconductor package according to some embodiments of the inventive concepts. Hereinafter, the descriptions to the same features as mentioned with reference to FIGS. 2 to 5 will be omitted for ease and convenience in explanation.

Referring to FIGS. 7A and 7B, a semiconductor package 12 may include a first power pad OUTP1, a second power pad OUTP2, a first wire pad WP1, and a second wire pad WP2.

Each of the first and second power pads OUTP1 and OUTP2 may correspond to the power pad OUTP of FIG. 3. The first and second power pads OUTP1 and OUTP2 may be spaced apart from each other.

Each of the first and second wire pads WP1 and WP2 may correspond to the wire pad WP of FIG. 3. The first and second wire pads WP1 and WP2 and the first and second power pads OUTP1 and OUTP2 may be spaced apart from each other.

In this case, a pair of first external connection terminals 152 may be provided. Voltages having different magnitudes may be applied to the pair of first external connection terminals 152, respectively. For example, the ground voltage may be applied to one of the pair of first external connection terminals 152, and the power voltage may be applied to the other of the pair of first external connection terminals 152.

A pair of first interconnection lines 110 may be provided. One of the pair of first interconnection lines 110 may connect the first power pad OUTP1 to one of the first external connection terminals 152, and the other of the pair of first interconnection lines 110 may connect the second power pad OUTP2 to the other of the first external connection terminals 152.

A pair of second interconnection lines 112 may be provided. One of the pair of second interconnection lines 112 may connect the first wire pad WP1 to the first substrate pad 120, and the other of the pair of second interconnection lines 112 may connect the second wire pad WP2 to the first substrate pad 120.

Here, the conductive connection member BW may selectively provide an electrical connection between the first power pad OUTP1 and the first wire pad WP1, or between the second power pad OUTP2 and the second wire pad WP2. Thus, the control chip 200 may recognize only one of the ground voltage and the power voltage.

Figure 8A:
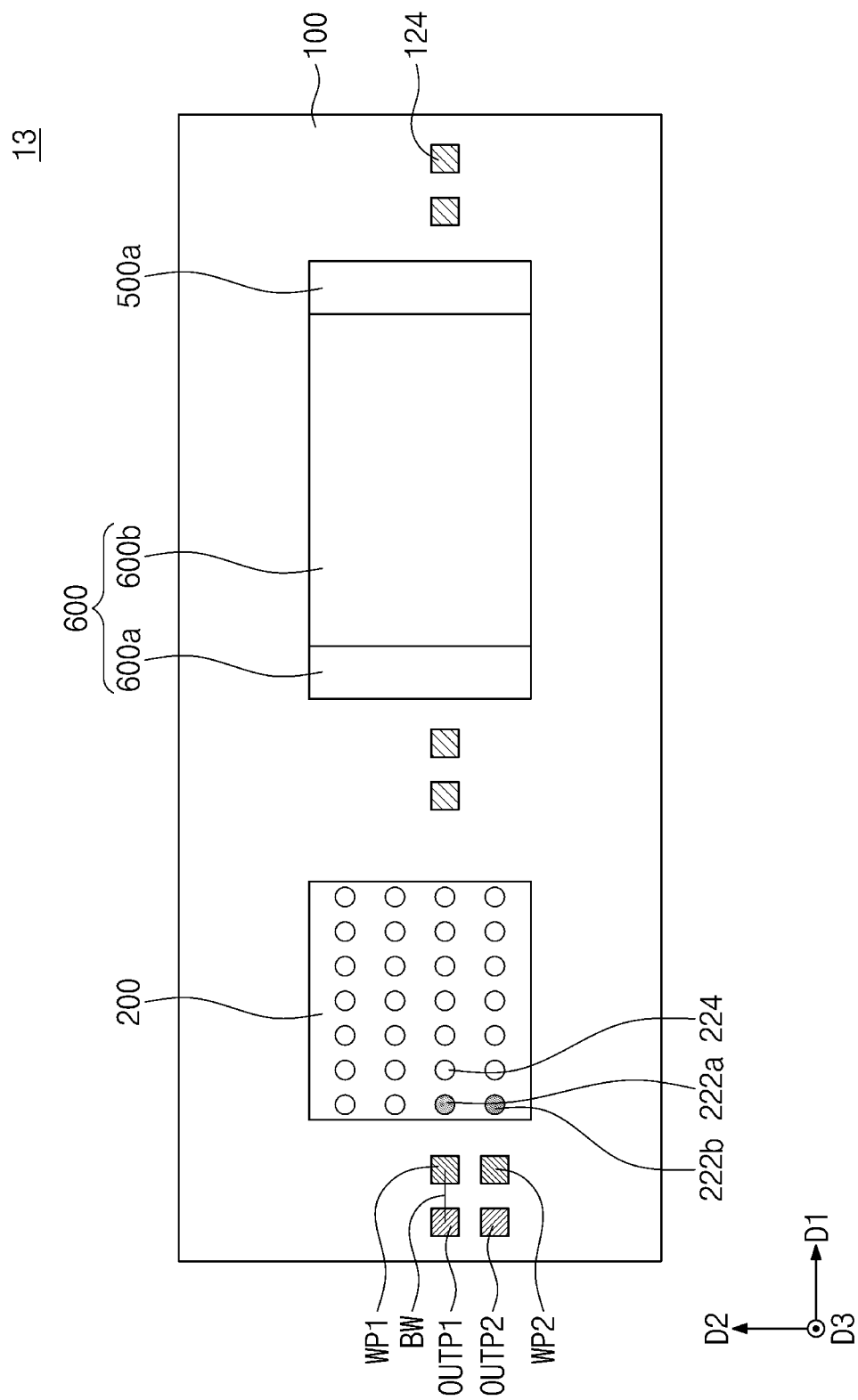

FIGS. 8A and 8B are plan views illustrating a semiconductor package according to some embodiments of the inventive concepts. Hereinafter, the descriptions to the same features as mentioned with reference to FIGS. 2 to 5 will be omitted for ease and convenience in explanation.

Referring to FIGS. 8A and 8B, a semiconductor package 13 may include a first power pad OUTP1, a second power pad OUTP2, a first wire pad WP1, a second wire pad WP2, a first mode selection connection terminal 222*a*, and a second mode selection connection terminal 222*b*.

Each of the first and second power pads OUTP1 and OUTP2 may correspond to the power pad OUTP of FIG. 3. The first and second power pads OUTP1 and OUTP2 may be spaced apart from each other.

Each of the first and second wire pads WP1 and WP2 may correspond to the wire pad WP of FIG. 3. The first and second wire pads WP1 and WP2 and the first and second power pads OUTP1 and OUTP2 may be spaced apart from each other.

Each of the first mode selection connection terminal 222*a* and the second mode selection connection terminal 222*b* may correspond to the mode selection connection terminal 222 of FIG. 3.

In this case, a pair of first external connection terminals 152 may be provided. Voltages having different magnitudes may be applied to the pair of first external connection terminals 152, respectively. For example, the ground voltage may be applied to one of the pair of first external connection terminals 152, and the power voltage may be applied to the other of the pair of first external connection terminals 152.

A pair of first interconnection lines 110 may be provided. One of the pair of first interconnection lines 110 may electrically connect the first power pad OUTP1 to one of the first external connection terminals 152, and the other of the pair of first interconnection lines 110 may electrically connect the second power pad OUTP2 to the other of the first external connection terminals 152.

A pair of first substrate pads 120 may be provided. One of the pair of first substrate pads 120 may vertically overlap with the first mode selection connection terminal 222a. The other of the pair of first substrate pads 120 may vertically overlap with the second mode selection connection terminal 222b.

A pair of second interconnection lines 112 may be provided. One of the pair of second interconnection lines 112 may connect the first wire pad WP1 to the one of the first substrate pads 120, which vertically overlaps with the first mode selection connection terminal 222a. The other of the pair of second interconnection lines 112 may connect the second wire pad WP2 to the other of the first substrate pads 120, which vertically overlaps with the second mode selection connection terminal 222b.

Here, the conductive connection member BW may selectively be used to provide electrical connection between the first power pad OUTP1 and the first wire pad WP1, or between the second power pad OUTP2 and the second wire pad WP2. Thus, a voltage may be selectively applied to one of the first mode selection connection terminal 222a and the second mode selection connection terminal 222b (i.e., the voltage may be provided to either the first mode selection connection terminal 222a or the second mode selection connection terminal 222b, but not both). As a result, the control chip 200 may selectively recognize one of the ground voltage and the power voltage.

The semiconductor package according to the inventive concepts may include the package substrate, the control chip on the package substrate, and the stack structure including the plurality of stacked memory chips on the package substrate.

The power pad provided at the top surface of the package substrate may be connected to the external connection terminal on the bottom surface of the package substrate through the first interconnection line in the package substrate. The substrate pad and the wire pad provided at the top surface of the package substrate may be connected to each other through the second interconnection line in the package substrate. The substrate pad may be connected to the control chip through the mode selection connection terminal between the control chip and the package substrate. In addition, the power pad and the wire pad may be selectively connected to each other by the conductive connection member, which is selectively provided. Thus, the control chip may be connected to the power pad by the conductive connection member that is external to or outside the package substrate, and not by an interconnection line in (e.g., within one or more layers of) the package substrate.

In this case, the mode selection may be performed using one kind (i.e., the same configuration) of the package substrate regardless of the channel number of the plurality of stacked memory chips. Thus, there is no need to manufacture an additional package substrate depending on the channel number. As a result, the process or fabrication cost of the semiconductor package may be reduced. In addition, the flip-chip method may be used to provide a bonding interface that reduces a length of an electrical path, and thus the electrical characteristics of the semiconductor package may be improved.

While the embodiments of the inventive concepts have been particularly shown and described, it will be understood by one of ordinary skill in the art that variations in form and detail may be made therein without departing from the scope of the attached claims.

What is claimed is:

1. A semiconductor package comprising:
    a package substrate having a first surface and a second surface that are opposite to each other;
    a control chip on the first surface of the package substrate;
    a mode selection connection terminal between the control chip and the package substrate;
    a stack structure spaced apart from the control chip on the first surface of the package substrate, the stack structure comprising a plurality of stacked memory chips;
    a first power pad adjacent the first surface of the package substrate;
    a wire pad adjacent the first surface of the package substrate and spaced apart from the first power pad;
    a first external connection terminal on the second surface of the package substrate; and
    a first interconnection line and a second interconnection line in the package substrate,
    wherein the first power pad and the wire pad are spaced apart from the control chip,
    wherein the first interconnection line electrically connects the first power pad to the first external connection terminal,
    wherein the second interconnection line electrically connects the wire pad to the mode selection connection terminal, and
    wherein the first external connection terminal is configured to provide a ground voltage or a power voltage to the first power pad.

2. The semiconductor package of claim 1, further comprising:
    a conductive connection member electrically connecting the first power pad to the wire pad, wherein the conductive connection member is external to the package substrate.

3. The semiconductor package of claim 1, further comprising:
    an external connection pad on the second surface of the package substrate and between the package substrate and the first external connection terminal,
    wherein the external connection pad is in contact with the first external connection terminal, and
    wherein the first interconnection line electrically connects the first power pad to the external connection pad.

4. The semiconductor package of claim 1, further comprising:
    a first substrate pad adjacent the first surface of the package substrate and in electrical contact with the mode selection connection terminal,
    wherein the second interconnection line electrically connects the wire pad to the first substrate pad, and
    wherein the package substrate is free of interconnection lines therein that electrically connect the wire pad to the first power pad.

5. The semiconductor package of claim 4, further comprising:
    a chip connection terminal under the control chip, the chip connection terminal being spaced apart from the mode selection connection terminal; and
    a second substrate pad adjacent the first surface of the package substrate and spaced apart from the first power pad, the wire pad, and the first substrate pad,
    wherein the chip connection terminal is electrically connected to the second substrate pad.

6. The semiconductor package of claim 5, further comprising:
- a third substrate pad adjacent the first surface of the package substrate and spaced apart from the first power pad, the wire pad, the first substrate pad, and second substrate pad;
- a metal connection line electrically connecting one or more of the stacked memory chips to the third substrate pad; and
- a third interconnection line in the package substrate and electrically connecting the second substrate pad to the third substrate pad.

7. The semiconductor package of claim 1, further comprising:
- a second power pad adjacent the first surface of the package substrate and spaced apart from the first power pad and the wire pad; and
- a second external connection terminal on the second surface of the package substrate and spaced apart from the first external connection terminal,
- wherein the second power pad is spaced apart from the control chip in plan view,
- wherein the second power pad is electrically connected to the second external connection terminal,
- wherein the first external connection terminal is configured to provide the ground voltage to the first power pad, and
- wherein the second external connection terminal is configured to provide the power voltage to the second power pad.

8. The semiconductor package of claim 7, further comprising:
- a conductive connection member electrically connecting the first power pad and the wire pad, or electrically connecting the second power pad and the wire pad.

9. A semiconductor package comprising:
- a package substrate;
- a control chip on the package substrate;
- a stack structure spaced apart from the control chip on the package substrate, the stack structure comprising a plurality of stacked memory chips;
- a first power pad, a second power pad, a first wire pad, and a second wire pad adjacent a top surface of the package substrate;
- a first external connection terminal and a second external connection terminal on a bottom surface of the package substrate;
- a pair of first interconnection lines and a pair of second interconnection lines in the package substrate;
- a mode selection connection terminal under the control chip; and
- a conductive connection member external to the package substrate that electrically connects the first power pad to the first wire pad, or electrically connects the second power pad to the second wire pad,
- wherein the first wire pad, the second wire pad, the first power pad, and second power pad are spaced apart from each other,
- wherein one of the pair of first interconnection lines electrically connects the first power pad to the first external connection terminal, and another of the pair of first interconnection lines electrically connects the second power pad to the second external connection terminal,
- wherein one of the pair of second interconnection lines electrically connects the first wire pad to the mode selection connection terminal, and another of the pair of second interconnection lines electrically connects the second wire pad to the mode selection connection terminal, and
- wherein the first external connection terminal and the second external connection terminal are configured to provide voltages having different magnitudes to the first power pad and the second power pad, respectively.

10. The semiconductor package of claim 9, wherein the control chip is mounted on the package substrate by a flip-chip bonding interface.

11. The semiconductor package of claim 10, wherein the first power pad, the second power pad, the first wire pad, and the second wire pad are spaced apart from the control chip in plan view.

12. The semiconductor package of claim 11, further comprising:
- a substrate pad adjacent the top surface of the package substrate and in contact with the mode selection connection terminal,
- wherein the one of the pair of second interconnection lines electrically connects the first wire pad to the substrate pad, and the another of the pair of second interconnection lines electrically connects the second wire pad to the substrate pad.

13. The semiconductor package of claim 9, wherein the first external connection terminal is configured to provide a ground voltage to the first power pad, and
- wherein the second external connection terminal is configured to provide a power voltage to the second power pad.

14. The semiconductor package of claim 9, wherein the conductive connection member comprises a bonding wire.

15. The semiconductor package of claim 14, further comprising:
- a metal connection line electrically connecting the stacked memory chips to the package substrate,
- wherein the metal connection line comprises a bonding wire.

16. The semiconductor package of claim 15, further comprising:
- a chip connection terminal under the control chip and spaced apart from the mode selection connection terminal;
- a substrate pad adjacent the top surface of the package substrate and in contact with the metal connection line; and
- a third interconnection line electrically connecting the chip connection terminal to the substrate pad.

17. A semiconductor package comprising:
- a package substrate;
- a control chip on the package substrate;
- a stack structure spaced apart from the control chip on the package substrate, the stack structure comprising a plurality of stacked memory chips;
- a first power pad, a second power pad, a first wire pad, and a second wire pad that are spaced apart from each other at a top surface of the package substrate;
- a first mode selection connection terminal and a second mode selection connection terminal between the control chip and the package substrate;
- a first external connection terminal and a second external connection terminal on a bottom surface of the package substrate; and
- a pair of first interconnection lines and a pair of second interconnection lines in the package substrate,
- wherein one of the pair of first interconnection lines electrically connects the first power pad to the first external connection terminal, and another of the pair of first interconnection lines electrically connects the second power pad to the second external connection terminal, wherein one of the pair of second interconnection lines electrically connects the first wire pad to the first mode selection connection terminal, and another of the pair of second interconnection lines electrically connects the second wire pad to the second mode selection connection terminal, and wherein the first mode selection connection terminal or the second mode selection connection terminal is selectively configured to be coupled to a voltage.

18. The semiconductor package of claim 17, wherein the first external connection terminal is configured to provide a ground voltage to the first power pad, and wherein the second external connection terminal is configured to provide a power voltage to the second power pad.

19. The semiconductor package of claim 17, further comprising:

a conductive connection member electrically connecting the first power pad and the first wire pad, or electrically connecting the second power pad and the second wire pad, wherein the conductive connection member is external to the package substrate.

20. The semiconductor package of claim 19, further comprising:

a metal connection line electrically connecting the stacked memory chips to the package substrate, wherein the conductive connection member and the metal connection line comprise bonding wires.

* * * * *